United States Patent [19]
Lee

[11] Patent Number: 5,650,780
[45] Date of Patent: Jul. 22, 1997

[54] DECODING FOR TRI-STATE READ-ONLY MEMORY

[75] Inventor: Fong-Chun Lee, Hsinchu, Taiwan

[73] Assignee: United Microelectronics Corporation, Taiwan

[21] Appl. No.: 426,903

[22] Filed: Apr. 21, 1995

[51] Int. Cl.$^6$ .................................................. H03M 5/16
[52] U.S. Cl. .............................. 341/57; 375/286; 371/56; 326/60
[58] Field of Search ............................ 341/57; 375/286; 371/56; 326/60

[56] References Cited

U.S. PATENT DOCUMENTS

| | | | |
|---|---|---|---|
| 3,866,147 | 2/1975 | De Couvreurdal | 332/11 R |
| 4,097,859 | 6/1978 | Looschen | 340/347 DD |
| 4,244,051 | 1/1981 | Fujikura et al. | 375/17 |
| 4,885,582 | 12/1989 | La Barge et al. | 341/57 |

OTHER PUBLICATIONS

Mano, M. Morris, Prof. Eng., California State University, Los Angeles "Computer System Architecture," Article, 10pp., Prentice–Hall, Inc., Englewood Cliffs, NJ, 1976.

*Primary Examiner*—Todd E. DeBoer
*Attorney, Agent, or Firm*—Cushman Darby & Cushman IP Group of Pillsbury Madison & Sutro, LLP

[57] ABSTRACT

A decoding method for tri-state read-only memory is disclosed herein. The cells of the tri-state memory are read the storage bits of all cells are combined to form a storage code. Each bit represents one of a first state, a second state and a third state. The storage code is first decoded to convert the storage code into an intermediate code. The intermediate code includes a plurality of conversion codes, each of which is one of a first code, a second code, and a third code corresponding respectively to the first, second, and third states. The intermediate code is further decoded into the binary output code. The resulting binary code has a greater number of bits than its corresponding storage code. Thus, the read-only memory, in accordance with the present invention, can store more than one bit of data in a single memory cell.

19 Claims, 3 Drawing Sheets

1

DECODING FOR TRI-STATE READ-ONLY MEMORY

BACKGROUND OF THE INVENTION

1. Field of the Invention

The invention relates in general to read-only memory (ROM). More particularly, the present invention relates to a decoding arrangement for tri-state read-only memory capable of storing more than one bit of data in a single memory cell.

2. Description of Related Art

ROM's (read-only memory) are widely used semiconductor integrated circuits (IC) memory storage devices for digital electronic equipment, in particular, microprocessor-based computer systems, to store predetermined programs. In a conventional semiconductor ROM device, the channel region of a memory cell is selectively implanted with ions to adjust the threshold voltage thereof depending on whether the programmed memory cell is turned on or turned off for representing a logic "1" or a logic "0" in binary, respectively. Conventional ROM IC devices, therefore, store a single binary bit in each of their memory cells. Then, conventional digital circuitry in ROM's employ sense amplifiers to sense the content of an addressed memory cell for "reading." However, the sensed result with respect to each memory cell within the ROM is identified as one of two possible electrical potential states. In other words, the memory content of a ROM memory cell as read is either a logic "1" or a logic "0".

The trend in the semiconductor industry has been to increase the number of memory cells to increase the storage capacity of a semiconductor integrated circuit chip, as well as reduce the size of the semiconductor device itself. Enlarged memory capacity and reduced memory semiconductor die size represent increased functionality and reduced cost, both of which are desirable qualities from a merchandising point of view. Great effort has been expended in the art of semiconductor chip manufacture to reduce the dimensions of semiconductor devices in order to squeeze more memory cells into the same semiconductor die area. This approach, however, is limited by the resolution available according to the current state of the art.

Increasing the number of states to which a memory cell can correspond is a practicable means for overcoming present limitations. Consequently, a tri-state read-only memory is set forth, whose threshold voltage is adjusted through ion implantation with different dosage to be 5V, 2.5V, or 0.8V, to have logic state designated as "1", "–", or "0", respectively However, because the output of the tri-state ROM should still be compatible with other digital systems, it should be able to convert an output tri-state signal into binary code.

SUMMARY OF THE INVENTION

It is therefore an object of the present invention to provide a decoding method for converting tri-state storage code into binary code.

It is another object of the present invention to provide a tri-state read-only memory decoding method that can be implemented with a conventional binary system.

The method essentially includes the following steps: reading each memory cell of the tri-state read-only memory and combining the contents to form a storage comprising a storage bit from each memory cell, each storage bit representing one of a first state, a second state, and a third state;

using a first decoding means to convert the storage code into an intermediate code, the intermediate code comprising a plurality of conversion codes, each of which is one of a first code, a second code, and a third code corresponding respectively to the first state, the second state, and the third state; and means to convert using a second decoding means, the intermediate code into a binary output code.

BRIEF DESCRIPTION OF THE DRAWING

Other objects, features and advantages of the present invention will become apparent by way of the following detailed description of the preferred but non-limiting embodiment. The description is made with reference to the accompanying drawings, wherein.

DETAILED DESCRIPTION OF THE PREFERRED EMBODIMENT

Figure 1:
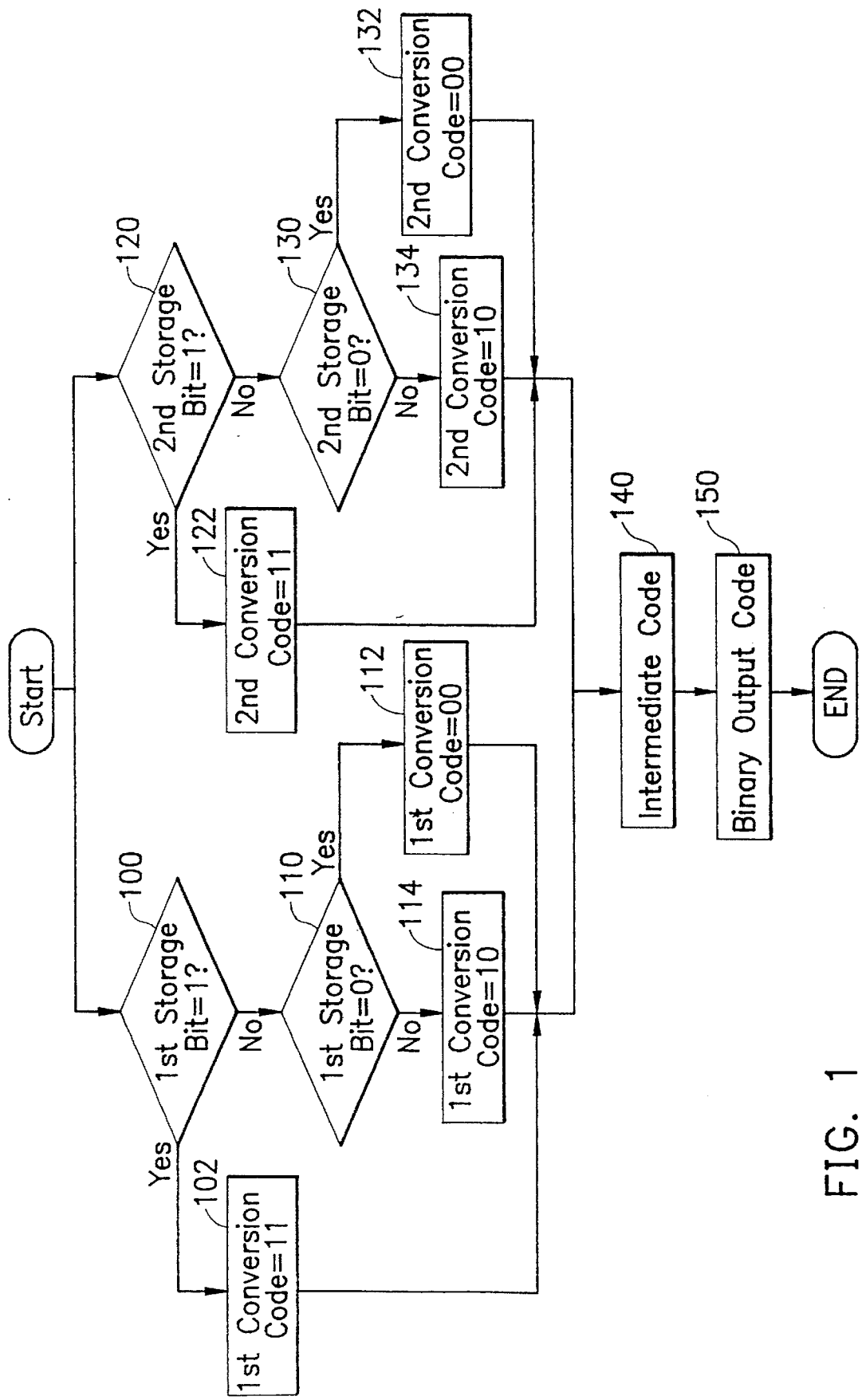
FIG. 1 is a flow chart of the method according to a preferred embodiment of the present invention.

The present invention, a decoding method for tri-state read-only memory, is used to convert a tri-state storage code into a binary output code. To form and program a memory cell in tri-state, the channel region of a semiconductor element, usually a MOS transistor, is selectively ion implanted with three different concentrations. These three different concentrations provide three different threshold voltages, such as 5V, 2.5V, or 0.8V to represent logic "1", "–", or "0" respectively. The flow chart shown in FIG. 1 is based on two memory cells, the contents of which, together, form a storage code. Each cell can represent one of three possible states. The contents of the cells are combined to form the storage code having first and second storage bits.

First, referring to FIG. 1, step 100 judges whether the first storage bit of the storage code is "1". If the first storage bit is "1", a first conversion code is set to "11" in step 102. Otherwise, the flow goes to step 110 to judge whether the first storage bit is "0" while unequal to "1"; therefore the first conversion code is set to "00" in step 112 while the first storage bit is equal to "0". If not, the flow proceeds to step 114 for decoding the first storage bit into the conversion code "10" because of the state "–". Up to this point in the process, the first storage bit is decoded into the first conversion code having "11", "10", or "00 " in accordance with its stored state being "1", "–", or "0". Simultaneously, following the similar procedure, the second storage bit is also decoded into a second conversion code having "11", "10", or "10" corresponding to the stored state is "1", "–", or "0" in steps 120, 122, 130, 132, and 134.

Next, the first storage bit and the second storage bit are incorporated to form an intermediate code "ABCD" in step 140. Then, in step 150, the intermediate code "ABCD" is decoded to a two-bit binary output code "$O_0 O_1 O_2$". Table 1 exemplifies a truth table among the storage code, the intermediate code, and the binary output code, wherein the conversion from the intermediate code to the binary output code only makes use of a decoding circuit that utilizes the Karnaugh Map method well known to persons skilled in this art.

TABLE 1

| storage code | intermediate code A B C D | binary output code $O_0 \, O_1 \, O_2$ |
| --- | --- | --- |
| 0 0 | 0 0 0 0 | 0 0 0 |
| 1 0 | 1 1 0 0 | 0 1 0 |
| 0 1 | 0 0 1 1 | 0 0 1 |
| 1 1 | 1 1 1 1 | 1 0 0 |
| — — | 1 0 1 0 | 1 1 1 |
| — 1 | 1 0 1 1 | 1 1 0 |
| 0 — | 0 0 1 0 | 0 1 1 |
| 1 — | 1 1 1 0 | 1 0 1 |

Figure 2:
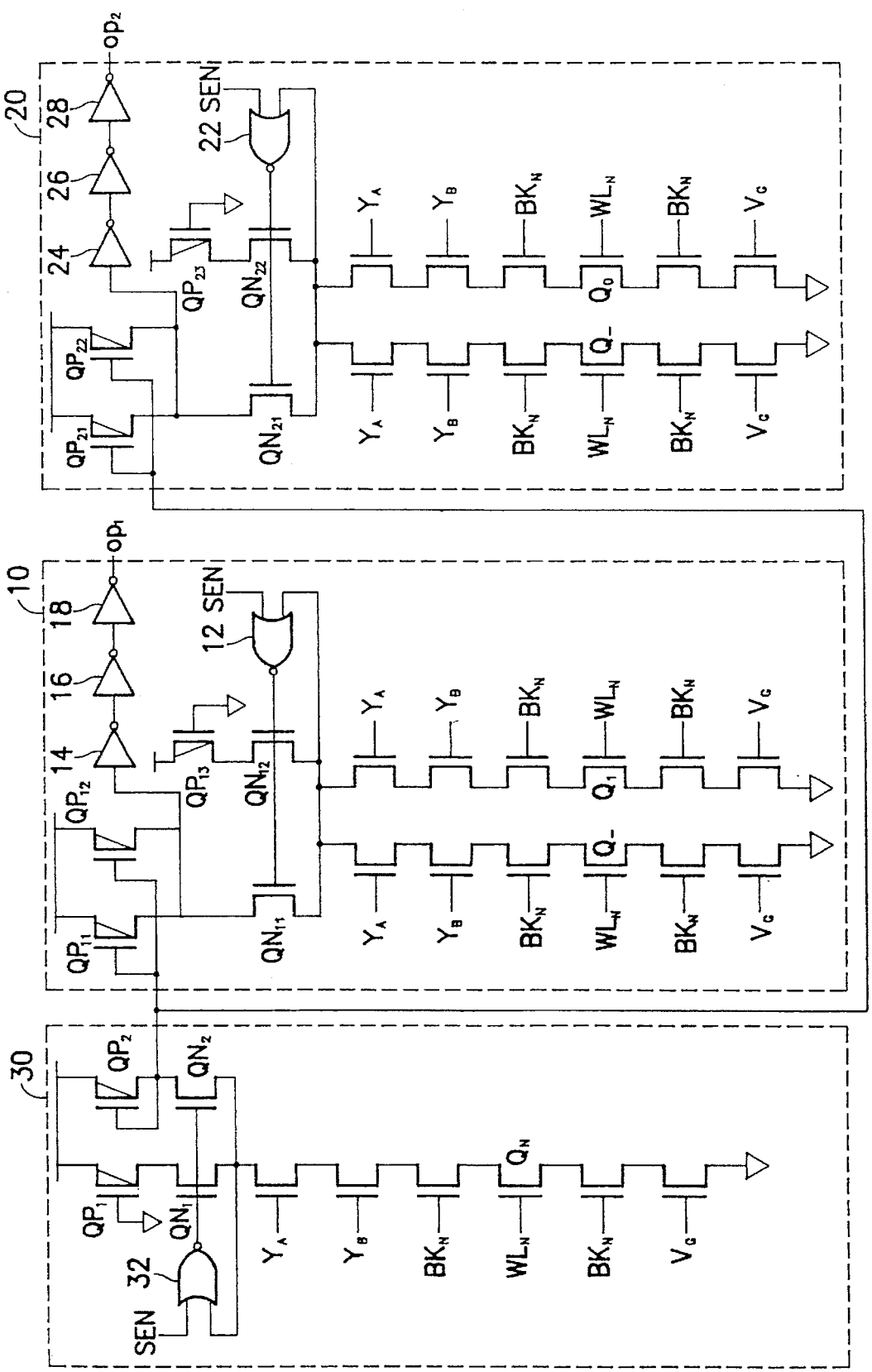
FIG. 2 is a schematic diagram showing a first decoding circuit for converting a storage bit into a conversion code according to FIG. 1.

A first decoding circuit is required to convert the storage code including first and second storage bits. One such circuit is schematically shown in FIG. 2. The first decoding circuit comprises a sense amplifier 30 and two comparators 10 and 20. A detailed description of each of these primary constituent parts follows. The memory cell of the memory array selected to be read is symbolized in the schematic diagram of FIG. 2 as a memory cell $Q_N$. As familiar to those who are skilled in this art, each memory cell is represented by a transistor device in the schematic diagram. The circuitry for selecting a particular transistor to be read is well known in the art and therefore is not described in detail herein.

As shown in FIG. 2, the sense amplifier 30 senses the electrical potential across the memory cell $Q_N$ to "read" the cell. Sense amplifier 30 includes two PMOS transistors $QP_1$ and $QP_2$, two NMOS transistors $QN_1$ and $QN_2$, and a NOR gate 32. Further, there exists two NMOS block transistors controlled by a signal $BK_N$, one NMOS transistor controlled by a signal $V_G$, and two NMOS select transistors controlled by two signals $Y_A$ and $Y_B$ respectively, wherein signals $BK_N$ and $V_G$ relate to the word line, and signals $Y_A$ and $Y_B$ relate to the bit line. The operation of these control signals is well known in this art and is not detailed herein. In simple terms, the NMOS transistors and the memory cell unit $Q_N$ are connected in series.

The gate of PMOS transistor QP1 is tied to ground, its source is tied to the system power source voltage $V_{cc}$, and its drain connected to the drain of NMOS transistor $QN_1$. PMOS transistor $QP_2$ has its source tied to $V_{cc}$, and its drain and gate are tied together and are connected to the drain of NMOS transistor $QN_2$. Gates of NMOS transistors $QN_1$ and $QN_2$ are both strobed by a sense enable signal SEN of the ROM device indirectly through NOR gate 32.

The sense enable signal SEN is utilized to conserve device power consumption of the entire ROM IC device during non-access period. The sources of NMOS transistors $QN_1$ and $QN_2$ are tied together and coupled to the NOR gate 32 as one input terminal and to those series-connected NMOS transistors, including memory cell $Q_N$, mentioned above. The gates of the NMOS block transistors are strobed by block signal $BK_N$, and the gate of NMOS select transistors are strobed by two select signals $Y_A$ and $Y_B$. With the application of the block signal $BK_N$ that drives NMOS block transistors, the memory electronics can be divided into sections that conveniently conserve power consumption.

Comparators 10 and 20 have a similar circuit configuration to one another and are somewhat similar to the configuration of sense amplifier 30. Comparator 10 comprises three PMOS transistors $QP_{11}$, $QP_{12}$ and $QP_{13}$, two NMOS transistors $QN_{11}$ and $QN_{12}$, and a NOR gate 12. The gate of PMOS transistor $QP_{13}$ is tied to ground, its source is tied to the power source voltage $V_{cc}$, and its drain connected to the drain of NMOS transistor $QN_{12}$. PMOS transistors $QP_{11}$ and $QP_{12}$ both have their sources tied to $V_{cc}$, their gates are tied together to the drain of PMOS transistor $QP_2$, and their drains connected together to the drain of NMOS transistor $QN_{11}$. Gates of NMOS $QN_{11}$ and $QN_{12}$ are both strobed by the sense enable signal SEN through the NOR gate 12.

Similarly, comparator 20 comprises three PMOS transistors $QP_{21}$, $QP_{22}$ and $QP_{23}$, two NMOS transistors $QN_{21}$ and $QN_{22}$, and a NOR gate 22. The gate of PMOS transistor $QP_{23}$ is tied to ground, its source is tied to the power source voltage $V_{cc}$, and its drain connected to the drain of NMOS transistor $QN_{22}$. PMOS transistors $QP_{21}$ and $QP_{22}$ both have their sources tied to $V_{cc}$, their gates are tied together to the drain of PMOS transistor $QP_2$, and their drains connected together to the drain of NMOS transistor $QN_{21}$. Gates of NMOS $QN_{21}$ and $QN_{22}$ are both strobed by the sense enable signal SEN through the NOR gate 22.

However, the aspect ratios of PMOS transistors $QP_{11}$ and $QP_{12}$ are the same as that of PMOS transistor $QP_2$ respectively, while the aspect ratio of PMOS transistor $QP_{13}$ is the same as that of PMOS transistor $QP_1$. Likewise, in terms of aspect ratio, transistors $QN_{11}$ and $QN_{12}$ are the same as those of $QN_1$ and $QN_2$. For the same reason, the corresponding relationship occurs in the comparator 20.

Comparators 10 and 20 each have a pair of serially connected NMOS transistors, similar to that of sense amplifier 30 except that transistor $Q_N$ is replaced by NMOS transistors $Q_-$ and $Q_1$, as well as NMOS transistors $Q_-$ and $Q_0$ respectively, connected in parallel, as shown in the figure. The threshold voltage of the NMOS transistors $Q_1$, $Q_-$ and $Q_0$ are 5V, 2.5V and 0.8V, respectively.

All the NMOS transistors $Q_N$, $Q_1$, $Q_-$ and $Q_0$ are gated or strobed by a common word line signal $WL_N$. The currents that flow through the NMOS transistors $Q_1$, $Q_-$ and $Q_0$, when the comparators 10 and 20 are gated on, are $IQ_1$, $IQ_-$ and $IQ_0$, respectively. As previously mentioned, the currents flowing through each of the memory cell transistors $Q_N$ of the ROM device, which have the three possible levels of ion implantation, are also either $IQ_1$, $IQ_-$ or $IQ_0$ (respectively corresponding to have threshold voltage 5V, 2.5V or 0.8V). Then, the current flowing through the comparators 10 and 20 will be $\frac{1}{2}(IQ_1+IQ_-)$ and $\frac{1}{2}(IQ_-+IQ_0)$ respectively.

An output terminal $op_1$ is tapped at the drain of the PMOS transistors $QP_{12}$ of the comparator 10 through three buffers (inverters) 14, 16 and 18, and another output terminal $op_2$ is tapped at the drain of the PMOS transistors $QP_{22}$ of the comparator 20 through three buffers (inverters) 24, 26 and 28. Both signals on any of output terminals $op_1$ and $op_2$ will be a high level, i.e. a logic 1, while the corresponding current flowing through the corresponding comparator 10 and 20 is greater than the current flowing through the memory cell transistor $Q_N$ in sense amplifier 30. Otherwise, the signal on the output terminal will be low, or logical 0.

Figure 3:
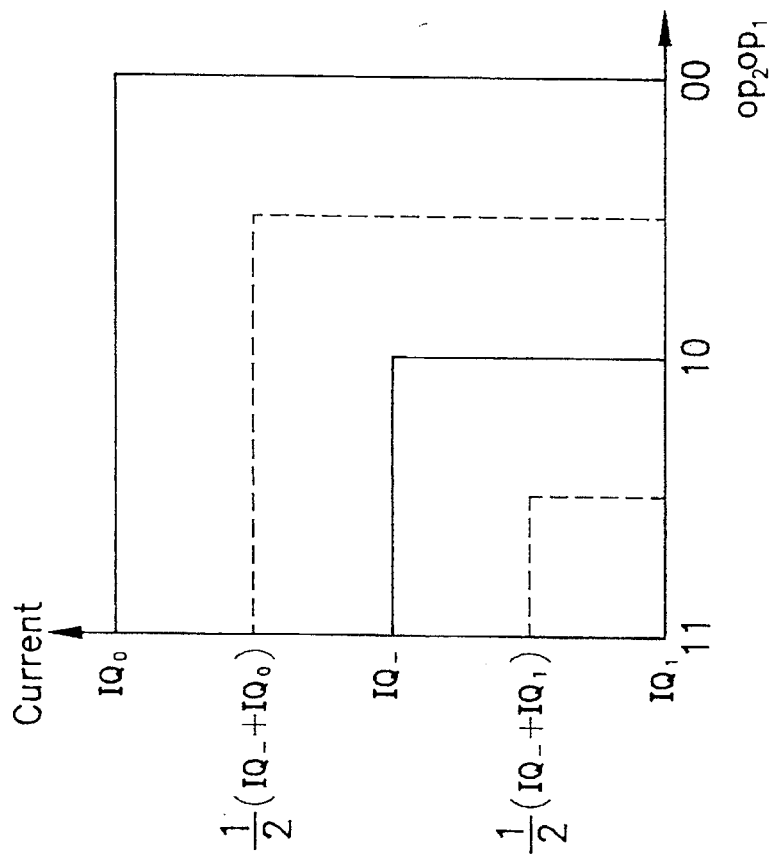
FIG. 3 depicts the output characteristics of the first decoding circuit of FIG. 2 with different storage content characteristics.

FIG. 3 is a graph showing the output characteristics of the first decoding circuit of FIG. 2 sensing a memory cell with different storage contents characteristics. The abscissa of the axis of the plot represents the output terminals $op_2$ and $op_1$ generally designated as $op_2op_1$ in the drawing. The ordinate of the axis, on the other hand, represents the current.

Currents $IQ_1$, $IQ_-$ and $IQ_0$ are arranged so as to satisfy the condition that $IQ_1 < IQ_- < IQ_0$ as is depicted in FIG. 3. To satisfy this condition, the threshold voltages of these transistors are adjusted by ion implantation with different dosages as persons skilled in this art can appreciate.

Assume, for example, the current flowing through the memory cell unit transistor $Q_N$ is $IQ_1$, with its threshold voltage being 5V. As is seen in FIG. 3, the current $IQ_1$ is the smallest in the shown scale, which indicates that it is smaller than the currents flowing in either of the comparators 10 and 20. Therefore, the output voltages, or their equivalent logic levels, as measured at output terminals $op_1$ and $op_2$ (generally designated as $op_2 op_1$ in FIG. 3), will be 1 and 1, as represented on the abscissa by the 11.

As another example, assume the current flowing in the memory cell unit transistor $Q_N$, is IQ__, which occurs when the threshold voltage of transistor $Q_N$ is adjusted into 2.5V, and then the logic levels as measured at output terminals $op_1$ and $op_2$ will be 1 and 0, as represented in the abscissa by a 10.

Figure 4:
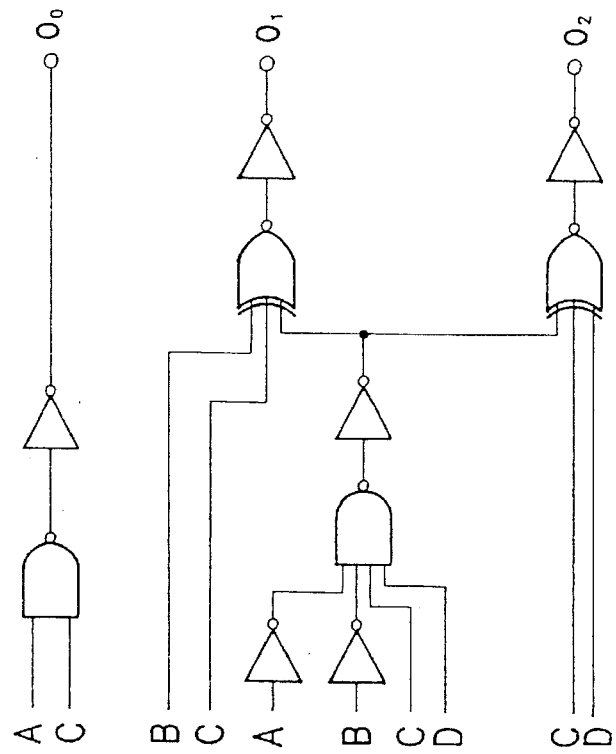
FIG. 4 is a schematic diagram showing a second decoding circuit for converting an intermediate code into a binary output code according to FIG. 1.

The intermediate code "ABCD" which represents a first conversion of the storage code, is further converted using a second decoder, such as the one shown in FIG. 4. This second decoder decodes the logic values represented by the intermediate code by logically operating on each of the conversion codes "AB" and "CD". Preferably, it uses the Karnaugh Map method to do this. The relationship between the intermediate code and the binary code as follows:

$$O_0 = A \cdot C$$

$$O_1 = B \oplus C \oplus \overline{A} \cdot \overline{B} \cdot C \cdot D$$

$$O_2 = C \oplus D \oplus \overline{A} \cdot \overline{B} \cdot C \cdot D$$

Persons skilled in this art can appreciate the fact that other similar electronic logics means can alternatively be employed to serve the decoding requirements equally well.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for decoding a tri-state storage code from a tri-state read-only memory into a binary output code, comprising the steps of:

reading a storage bit of each cell of the tri-state read-only memory, each bit representing one of a first state, a second state and a third state;

combining the storage bits to form a storage code;

first decoding to convert the storage code into an intermediate code, the intermediate code comprising a plurality of conversion codes, each of which is one of a first code, a second code, and a third code corresponding respectively to the first, second, and third states; and second decoding the intermediate code into the binary output code.

2. The decoding method as in claim 1, wherein the number of bits in the binary code is larger than the number of storage bits forming the storage code.

3. The decoding method as in claim 1, wherein the number of the conversion codes is the same as the number of storage bits.

4. The decoding method as in claim 1, wherein the reading step comprises the step of reading from a read-only memory of MOS transistors.

5. The decoding method as in claim 4, wherein the first state, the second state, and the third state are stored based on different threshold voltages.

6. The decoding method as in claim 1, wherein the first decoding is carried out using a decoding means comprising two comparators having two reference signals for comparing with each of the storage bits then to form the conversion codes, respectively.

7. The decoding method as in claim 1, wherein the second decoding is carried out using a second decoding means comprising a plurality of logic gates defined through the Karnaugh Map method.

8. A method for decoding a tri-state storage code from a tri-state read-only memory into a binary output code, comprising the steps of:

reading a storage bit of each cell of the tri-state read-only memory, each storage bit representing one of a first state, a second state and a third state;

combining the storage bits to form a storage code;

first decoding to convert the storage code into an intermediate code, the intermediate code comprising a plurality of conversion codes, each of which is one of a first code, a second code and a third code corresponding respectively to the first state, second state and third state; and second decoding the intermediate code into the binary output code, a number of bits in the binary code being larger than a number of storage bits forming the storage code.

9. The decoding method as in claim 8, wherein:

a number of said plurality of conversion codes equal to the number of storage bits.

10. The decoding method as in claim 8, wherein the reading step comprises:

reading from a read-only memory of MOS transistors.

11. The decoding method as in claim 10, wherein:

the first state, the second state and the third state are stored based on respectively different threshold voltages.

12. The decoding method as in claim 8, wherein:

the first decoding is carried out using decoding means comprising two comparators having two reference signals for comparing with each of the storage bits then to form a respective one of the plurality of conversion codes.

13. The decoding method as in claim 8, further comprising:

applying a Karnaugh Map method with respect to a relationship between the intermediate code and the binary output code to define second decoding means, said second decoding means comprising a plurality of logic gates; and performing the step of second decoding using the second decoding means.

14. A method of decoding a tri-state storage code from a tri-state read-only memory into a binary output code, comprising:

reading a storage bit of each cell of the tri-state read-only memory, each storage bit representing one of a first state, a second state and a third state;

first decoding to convert each storage bit into an associated one of a plurality of conversion codes, each of which is one of a first code, a second code and a third code corresponding respectively to the first state, second state and third state;

combining the conversion codes associated with each storage bit to form an intermediate code;

second decoding the intermediate code into the binary output code, a number of bits in the binary code being larger than a number of storage bits forming the storage code.

15. The method of claim 14, wherein said first decoding of each storage bit comprises:

determining whether a storage bit represents the first state and, if so, associating the first conversion code with said storage bit;

if the storage bit does not represent the first state, determining whether the storage bit represents the second state and, if so, associating the second conversion code with the storage bit; and if the storage bit does not represent the first state and does not represent the second state, associating the third code with the storage bit.

16. The decoding method as in claim 14, wherein the reading step comprises:

reading from a read-only memory of MOS transistors.

17. The decoding method as in claim 14, wherein:

the first state, the second state and the third state are stored based on respectively different threshold voltages.

18. The decoding method as in claim 14, wherein:

the first decoding is carried out using decoding means comprising two comparators having two reference signals for comparing with each of the storage bits then to form a respective one of the plurality of conversion codes.

19. The decoding method as in claim 14, further comprising:

applying a Karnaugh Map method with respect to a relationship between the intermediate code and the binary output code to define second decoding means, said second decoding means comprising a plurality of logic gates; and performing the step of second decoding using the second decoding means.

* * * * *